United States Patent
Wang (10) Patent No.: US 7,911,192 B2
(45) Date of Patent: Mar. 22, 2011

(54) HIGH VOLTAGE POWER REGULATION USING TWO POWER SWITCHES WITH LOW VOLTAGE TRANSISTORS

(75) Inventor: Zhenhua Wang, Zurich (CH)

(73) Assignee: ST-Ericsson SA, Plan-les-Ouates (CH)

( * ) Notice: Subject to any disclaimer, the term of this patent is extended or adjusted under 35 U.S.C. 154(b) by 336 days.

(21) Appl. No.: 12/096,232

(22) PCT Filed: Dec. 4, 2006

(86) PCT No.: PCT/IB2006/054585
§ 371 (c)(1),
(2), (4) Date: Jun. 5, 2008

(87) PCT Pub. No.: WO2007/066278
PCT Pub. Date: Jun. 14, 2007

(65) Prior Publication Data
US 2008/0309307 A1   Dec. 18, 2008

(30) Foreign Application Priority Data
Dec. 8, 2005   (EP) .................................. 05301026

(51) Int. Cl.
G05F 1/652   (2006.01)
G05F 1/656   (2006.01)
(52) U.S. Cl. ......... 323/282; 323/284; 323/222; 323/223
(58) Field of Classification Search .................. 323/282, 323/284, 222, 223
See application file for complete search history.

(56) References Cited

U.S. PATENT DOCUMENTS

| | | | | |
|---|---|---|---|---|
| 6,184,667 B1* | 2/2001 | Lacey | ........................... | 323/282 |
| 6,853,569 B2* | 2/2005 | Cheng et al. | .................... | 363/97 |
| 7,276,888 B2* | 10/2007 | Thiele et al. | .................. | 323/282 |
| 2004/0141345 A1 | 7/2004 | Cheng et al. | | |
| 2005/0088856 A1 | 4/2005 | Yamamoto et al. | | |
| 2007/0075693 A1* | 4/2007 | Xi | ................. | 323/282 |
| 2008/0191679 A1* | 8/2008 | Williams | ...................... | 323/282 |
| 2008/0203991 A1* | 8/2008 | Williams | ...................... | 323/288 |

FOREIGN PATENT DOCUMENTS

JP   2005-268895 A   9/2005

* cited by examiner

*Primary Examiner* — Bao Q Vu
(74) *Attorney, Agent, or Firm* — Robert Iannucci; Seed IP Law Group PLLC (57) ABSTRACT

A switching regulator having first and second power switches. The first power switch has at least two transistors connected in series, the transistors having a first maximum voltage across their terminals which is less than the input voltage of the regulator. The transistors have at least a first node at the point where they are connected, and a first control circuit controls the voltage at the first node so that the voltages across the terminals of the transistors of the first power switch do not exceed the first maximum voltage. The second power switch also has at least two transistors connected in series, the transistors having a maximum voltage across their terminals that is less than the input voltage. The transistors have at least a second node at the point where they are connected, and a second control circuit controls the voltage at the second node so that the voltages across the terminals of the transistors of the second power switch do not exceed the second maximum voltage.

17 Claims, 10 Drawing Sheets

HIGH VOLTAGE POWER REGULATION USING TWO POWER SWITCHES WITH LOW VOLTAGE TRANSISTORS

FIELD OF THE INVENTION

The invention relates to a high voltage power switch constructed using low voltage transistors. In particular, the invention relates to a switching regulator having first and second power switches, where each power switch has at least two transistors connected in series.

BACKGROUND OF THE INVENTION

Semiconductor manufacturing technology is driven by digital circuits such as microcontrollers, digital signal processors, memories, etc. The systems which use these circuits are getting more sophisticated and complex, their performance is increasingly enhanced and more features are being added, requiring more transistors to be integrated on a chip and higher computing power. To accommodate these needs while lowering costs, semiconductor device manufacturers have introduced ever smaller geometries in their semiconductor process to reduce transistor size and squeeze more transistors on a single silicon wafer.

The smaller geometries require a corresponding reduction in the supply voltage for these circuits. However, the rechargeable battery voltage has remained largely unchanged. For example, the supply voltage of the currently available 90 nm and 65 nm standard CMOS processes has dropped to 1.2V, whereas the voltage of a fully charged lithium ion battery pack remains up to 5.0V. This incompatibility in supply voltage causes problems in system design and prevents microcontrollers from being powered directly by battery. The approach to circumvent this dilemma is to use a dedicated switching or voltage regulator to convert the battery voltage to the required supply voltage for the microcontroller.

Figure 1A:
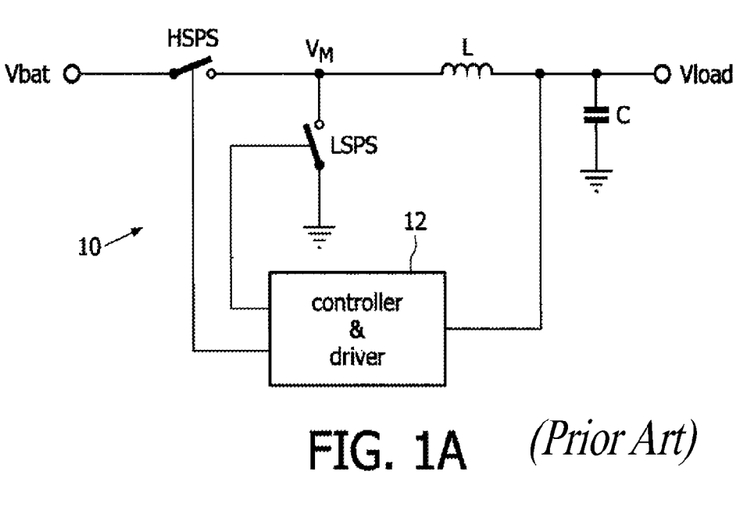
FIG. 1A is a circuit diagram of a conventional step-down switching regulator.

Power switches are key component in designing switching regulators. As these power switches are turned on and off, DC-DC conversion is performed with high power efficiency. FIG. 1A shows a circuit diagram of a basic step-down switching regulator (10). The circuit includes a high-side power switch (HSPS), low-side power switch (LSPS), inductor (L), capacitor (C), and controller and driver circuit (12). The high-side power switch may be a p-type transistor and low-side power switch an n-type transistor.

Figure 1B:
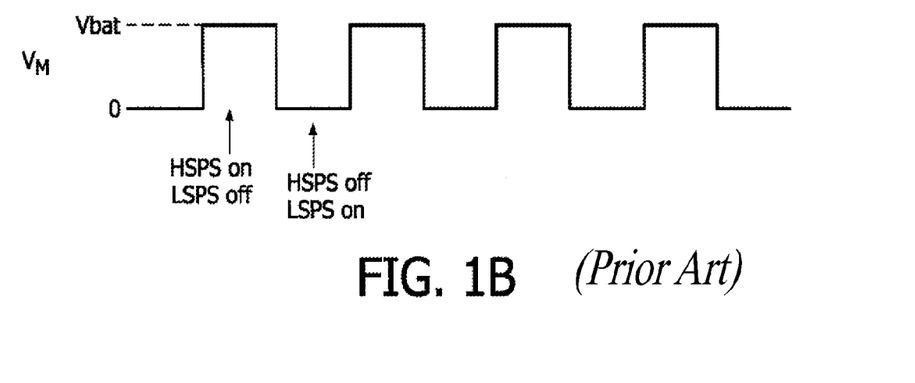
FIG. 1B is a diagram showing the waveform at node $V_M$ in the regulator of FIG. 1A.

One conversion cycle consists of two modes of operation. First, HSPS is turned on and LSPS is off, so that battery voltage (Vbat) is applied at the left terminal of the inductor and the current flowing through the inductor increases. Then HSPS is turned off. At the same time, LSPS is turned on to provide a path for the inductor current which is now decreasing. The inductor and capacitor form a low-pass filter so that the converted low voltage over the load (Vload) remains fairly constant except for a small ripple. This process repeats cycle by cycle. The voltage at the midpoint where the two power switches HSPS and LSPS are connected ($V_M$) is also shown in FIG. 1A. FIG. 1B shows the variation in the midpoint voltage ($V_M$) for several cycles of the switching regulator. Both power switches must be able to withstand a voltage up to the input voltage to the switching regulator, i.e. the battery voltage (Vbat).

Currently, the most widely used battery type for portable or hand-held electronic devices such as cellular phones and MP3 players, is the lithium ion battery. Typically, a fully charged lithium ion battery pack reaches a voltage of up to 5V. As the battery discharges its voltage decreases, with the lowest allowed voltage being about 3.0V. Clearly, the two power switches in the switching regulator of FIG. 1A must withstand 5V. However, the maximum allowed voltage for CMOS transistors in the current state-of-the-art 65 nm process technology is only 2.5V.

Currently, regulators are available as stand alone integrated circuits and their manufacturing entails a high-voltage semiconductor process. Such processes include the bipolar and bipolar CMOS (BiCMOS) processes. In addition, various other high-voltage CMOS processes have been developed, but they are generally more expensive to use than standard CMOS processes, and are not used for microprocessors or DSPs. Another conventional solution has been to use MOS transistors with an extended drain. However, such devices with an extended drain have to be characterized before they can be utilized. Another drawback is that the extended drain only permits the drain-to-source voltage to be increased, whereas the maximum gate-to-source and gate-to-drain voltages are not affected and remain a problem.

The invention seeks to address these problems by providing a method of realizing high-voltage power switches using transistors made using a standard 65 nm CMOS process. These proposed switches can also be used in class-D audio power amplifiers.

SUMMARY OF THE INVENTION

In accordance with the invention, a switching regulator is provided having first and second power switches. The first power switch has at least two transistors connected in series, the transistors having at least a first node at the point where two of the transistors are connected. A first control circuit is also provided for setting the voltage at the first node to a first intermediate voltage when the first power switch is turned off. The second power switch also comprises at least two transistors connected in series, the transistors having at least a second node at the point where two of the transistors are connected. A second control circuit is for setting the voltage at the second node to a second intermediate voltage when the second power switch is turned off.

The first power switch may be connected between an input of the switching regulator and a third node and the second power switch is connected between a common voltage and the third node. The first control circuit may comprise a switch for connecting a gate terminal and a source terminal of one of the series connected transistors of the first power switch.

Where the series-connected transistors of the first power switch have a first maximum permitted voltage across their terminals which is less than the input voltage of the switching regulator, the first intermediate voltage is preferably greater than or equal to the input voltage less the first maximum permitted voltage. Similarly, where the series-connected transistors of the second power switch have a second maximum permitted voltage across their terminals which is less than the input voltage of the switching regulator, then preferably the second intermediate voltage is less than or equal to the second maximum permitted voltage. The first intermediate voltage may be equal to the input voltage less the second intermediate voltage.

One of the series connected transistors of the first power switch may have a gate terminal that is switched while another of the series connected transistors of the first power switch has a gate terminal which is not switched. The first control circuit may comprise a switch for connecting a gate terminal to a source terminal of the non-switched series connected transistor of the first power switch.

The first power switch may comprise two transistors connected in series, the gate terminal of the first transistor being switched between the input voltage and the first intermediate voltage, and the gate terminal of the second transistor being fixed at the first intermediate voltage, and the first control circuit may comprise a transistor for electrically connecting the first node to the first intermediate voltage.

The invention also provides for a power supply circuit or an audio power amplifier circuit which includes the switching regulator and a control signal generator for providing signals for switching at least one the transistors of each of the power switches of the switching regulator, and an internal power supply for providing the first and second intermediate voltages.

Furthermore, the invention includes a method for operating a switching regulator having an input voltage, where the switching regulator includes first and second power switches each having at least two transistors connected in series, the transistors having a maximum permitted voltage across their terminals which is less than the input voltage, the transistors in the first power switch having a first node at the point where two of the transistors are connected, and the transistors in the second power switch having a second node at the point where two of the transistors are connected. The method includes the step of setting the voltage at the first node to a first intermediate voltage when the first power switch is turned off, so that the voltages across the terminals of the transistors of the first power switch do not exceed the maximum permitted voltage. The method also includes the step of setting the voltage at the second node to a second intermediate voltage when the second power switch is turned off, so that the voltages across the terminals of the transistors of the second power switch do not exceed the maximum permitted voltage.

The first intermediate voltage is preferably greater than or equal to the input voltage less the first maximum permitted voltage, and the second intermediate voltage is preferably less than or equal to the second maximum permitted voltage. The first intermediate voltage may be equal to the input voltage less the second intermediate voltage.

The switching regulator and the method of operating a switching regulator both operate to control the voltage across the terminals of the series-connected transistors of the power switches. Thus, the voltage across the transistors may be maintained at a level below the maximum permitted voltages for the transistors, and transistors having a maximum permitted voltage that is below the input voltage of the switching regulators can be safely used. The invention thus controls the voltages across the transistors and also operates efficiently under a varying battery voltage.

BRIEF DESCRIPTION OF THE DRAWINGS

Further aspects, features and advantages of various embodiments of the invention will become apparent from the following description, given by way of example only, of preferred embodiments of the invention, referring to the accompanying drawings, wherein.

DESCRIPTION OF THE PREFERRED EMBODIMENTS

This invention explores circuit techniques and proposes a circuit arrangement for realizing high-voltage power switches using standard, low-voltage CMOS transistors. The idea is to distribute the high-voltage over two or more transistors connected in cascoding. In this way, a 5V power switch, for example, can be implemented by cascoding two switches each using 2.5V transistors. In designing a cascoding power switch, some key technical issues have to be solved.

Cascoding alone does not solve the problem. For example, by connecting two MOS transistors in cascoding, the drain-to-source voltage of both transistors can be halved, similar to the extended-drain MOSFET. However, gate-to-source and gate-to-drain voltage need to be carefully designed to avoid overvoltage, and to drive the power switches on and/or off. In addition, the design should avoid merely shifting the high-voltage problem from the power switch to somewhere else, for example, the switch driver circuit. Another concern is the overvoltage during switching transitions.

Figure 2:
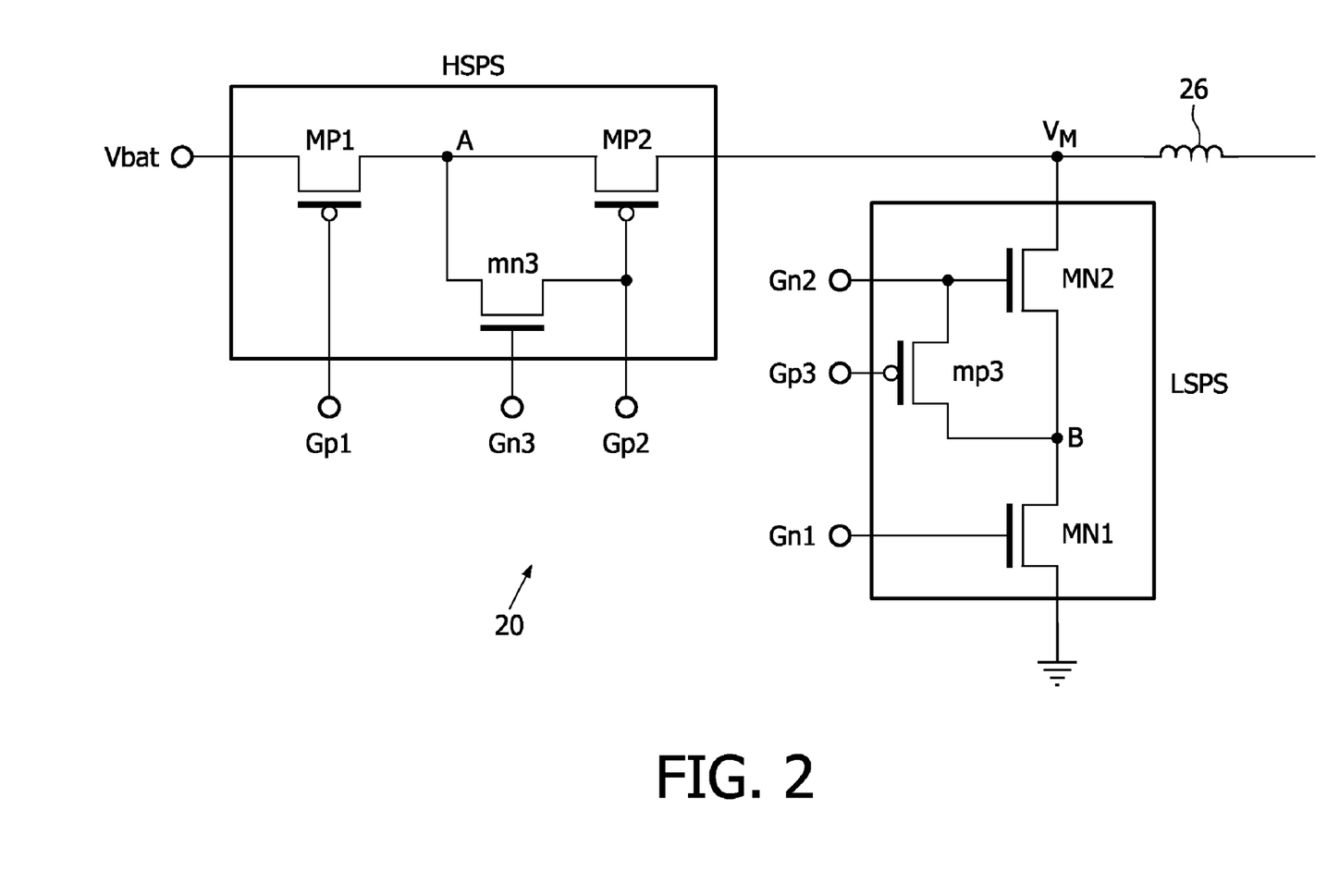
FIG. 2 shows an arrangement of two power switches for use in a switching regulator according to one embodiment of the invention.

FIG. 2 shows an arrangement of two power switches for use in a switching regulator. Each power switch is constructed using three MOS transistors. Power switch HSPS is constructed with two pMOS transistors MP1 and MP2 connected in series (cascode) arrangement, and an nMOS transistor mn3. Power switch LSPS is constructed with two nMOS transistors MN1 and MN2 connected in series (cascode) arrangement, and a pMOS transistor mp3. Transistors MP1, MP2, MN1, and MN2 will conduct a large current and have a large size to accommodate the current. By contrast, transistors mp3 and mn3 are small-sized transistors. The difference in transistor size is highlighted by the size of transistor symbol in FIG. 2.

The gate terminal Gp2 of p-type transistor MP2 is connected to a DC voltage Vp1, while the gate terminal Gn2 of n-type transistor MN2 is connected to another DC voltage Vnh. The gate terminals of other transistors are switched between two carefully chosen levels. The operation of the power switches HSPS, LSPS is explained with reference to the transistor control voltages shown in FIG. 3.

Figure 3:
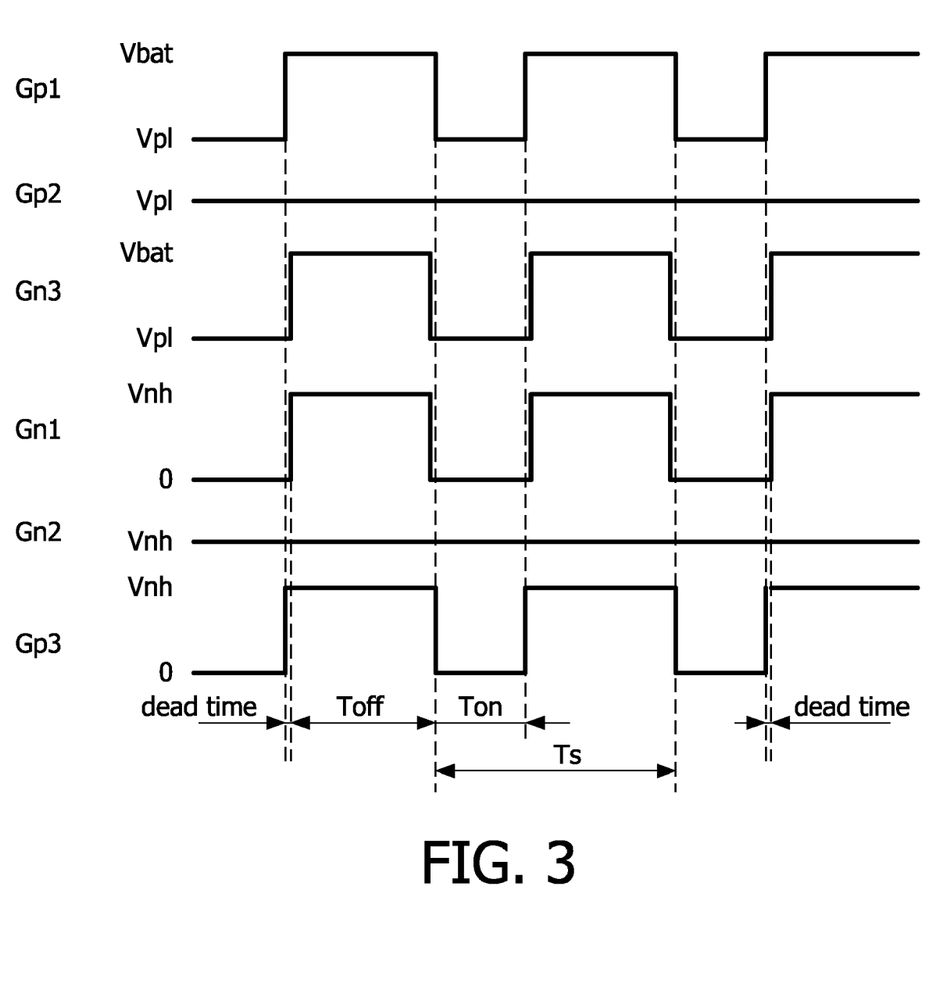
FIG. 3 is a diagram showing the variation of gate voltages for the switching regulator of FIG. 2.

During time Ton shown in FIG. 3, power switch HSPS is on and power switch LSPS is off. During this period, an intermediate voltage Vp1 is applied to the gate Gp1 of p-type transistor MP1, where $|V_{Tp}|<Vbat-Vp1<V_{GSpmax}$, and $|V_{Tp}|$ is the absolute value of the threshold voltage of the transistor and $V_{GSpmax}$ is the maximum gate-source voltage of the transistor. This causes MP1 to turn on. Voltage Vp1 is also applied to the gates Gp2, Gn3 of p-type transistor MP2 and n-type transistor mn3 during this time, so that MP2 is turned on and mn3 is turned off. Thus, MP1 and MP2 are on and power switch HSPS is on during the period Ton. At the same time, LSPS is turned off. The voltage on the gate Gn1 of n-type transistor MN1 is zero turning MN1 off. The voltage on the gate Gp3 of the p-type small transistor mp3 is zero turning mp3 on. This sets the voltage at node B to Vnh, and turns n-type transistor MN2 off. Assuming the on-resistance of both power switches MP1 and MP2 is zero, the voltage at node $V_M$ reaches Vbat.

During time Toff shown in FIG. 3, power switch HSPS is switched off and power switch LSPS is switched on. Voltage Vbat is applied to the gate Gp1 of p-type transistor MP1, turning MP1 off. Voltage Vbat is also applied to the gate Gn3 of n-type small transistor mn3, turning mn3 on and setting the voltage at node A to Vp1. Transistors MP1 and MP2 in the off-state because the gate-to-source voltages of both transistors are now 0V. Thus, HSPS is off during period Toff. The intermediate voltage Vnh is applied to the gate Gn1 of n-type transistor MN1, where $V_{Tn} < Vnh < V_{GSnmax}$, where $V_{Tn}$ is the threshold voltage of the transistor and $V_{GSnmax}$ is the maximum gate-source voltage of the transistor. This causes MN1 to turn on. Voltage Vnh is also applied to the gates Gn2 and Gp3 of n-type transistor MN2 and p-type transistor mp3 during this time, turning MN2 on and mp3 off. Both MN1 and MN2 are on and power switch LSPS is on during period Toff. As a result, the voltage at node $V_M$ drops to 0V.

In the absence of the small transistors mn3 and mp3, the voltages at nodes A and B may be floating when HSPS or LSPS is turned off. To avoid shoot-through current, MP1 must be turned off before mn3 turns on, and MN1 must be turned off before mp3 turns on. Likewise, mn3 must be turned off before MP1 is switched on, and mp3 must be turned off before MN1 is switched on. Also from FIG. 3 it is seen that HSPS should not turn on until LSPS is turned off. Similarly, LSPS should not turn on until HSPS is turned off. All these requirements can be accommodated by incorporating a dead time as indicated in FIG. 3 to prevent shoot-through current through the power switches during switch transition.

In the arrangement described above, the cascode transistors do not suffer overvoltage as a result of controlling of the junction node voltages at nodes. The terminal voltages of the cascoding transistors are only kept within safe limits if not only the gate, but also the junction nodes A and B between the cascode transistors are properly controlled. For example, if the input voltage Vbat is up to 5.0V, and Vmax=2.5V for 90 nm and 65 nm CMOS processes, then two transistors may be cascoded. For power switch LSPS, these are transistors MN1 and MN2. A constant DC voltage Vnh of 2.5V can be applied at the gate of MN2, whereas the gate of MN1 is switched between 0V and 2.5V. When the gate of MN1 is at 2.5V, power switch LSPS is turned on. At the same time, power switch HSPS is off, and $V_M$=0V. The junction node B between MN1 and MN2 is also at 0V. All voltages across the terminals of both MN1 and MN2 are maintained within 2.5V, the maximum permitted voltage across the terminals of the transistor. To turn LSPS off, the gate voltage of MN1 is switched to 0V. At the same time, HSPS is turned on, pulling $V_M$ up to 5.0V. The voltage at junction node B between MN1 and MN2 is now fixed at 2.5V (Vnh) via small-sized transistor mp3, and all voltages across the terminals of both MN1 and MN2 are again maintained within 2.5V. MN1 and MN2 are both cut off because for each transistor's gate and source are short circuited. This control scheme ensures that all transistors are safe and overvoltage stress does not occur. Control of the voltage at node A between transistors MP1 and MP2 of power switch HSPS is also provided by the small-sized transistor mn3, ensuring that all voltages across the terminals of both MP1 and MP2 are again maintained within 2.5V.

It should be noted that in the arrangement of FIG. 2, the outer MOS transistors (MP1 and MN1) are turned on or off by switching gate voltages. The inner MOS transistors (MP2 and MN2) are not switching, but are biased at a constant DC because switching the inner MOS transistors is less efficient. This arrangement reduces power consumption and improves power efficiency.

Figure 4:
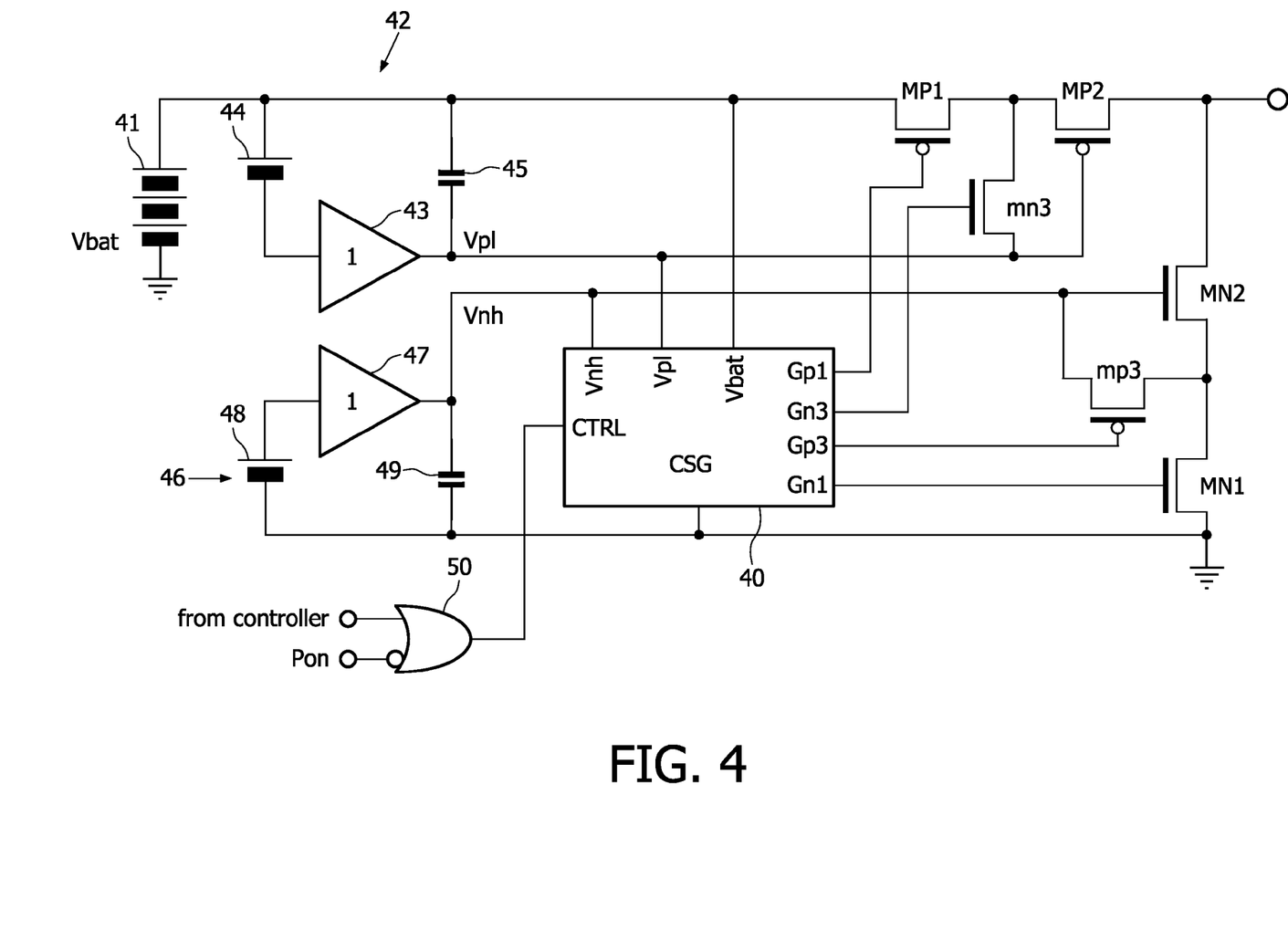
FIG. 4 is a circuit diagram of a switching regulator incorporating the power switch arrangement of FIG. 2.

FIG. 4 shows an implementation of a switching regulator incorporating the power switches of FIG. 2. A control signal generator 40 is powered by voltages Vbat, Vp1, and Vnh, and generates control signals Gp1, Gn3, Gp3, and Gn1. Voltage Vbat is derived from battery 41. The intermediate voltage Vp1 is derived from voltage Vbat by circuit 42, comprising buffer 43 with reference voltage 44 and filtering capacitor 45. Similarly, intermediate voltage Vnh is derived by circuit 46, comprising buffer 47 with reference voltage 48 and filtering capacitor 49. Control signal Gp1 is connected to the gate of transistor MP1, control signal Gn3 is connected to the gate of transistor mn3, control signal Gp3 is connected to the gate of transistor mp3, and control signal Gn1 is connected to the gate of transistor MN1. The gates of transistors MP2 and MN2 are tied to voltages Vp1 and Vnh respectively. Transistors MP1, MP2 and mn3 comprise power switch HSPS, and transistors MN1, MN2 and mp3 comprise power switch LSPS, as shown in FIG. 2.

The CTRL signal for control signal generator 40 may be derived, for example, from a pulse width modulation (PWM) controller (not shown in the drawing). The PWM controller outputs a control signal having a varying pulse width. PWM is conventional a technique used in DC-DC switching regulators where the duty cycle of the control signal driving the main power switches is varied with the load in order to maintain a constant output voltage. The technique is also used in DC motor-control applications to vary motor RPM and in communications to modulate a pulsed signal. The output of the PWM controller is applied to one input of OR gate 50, and a power on/off control signal Pon is applied to another input. When Pon=1, the switching regulator is in normal operating mode, and when Pon=0 the regulator is turned off. In this off mode, the output of OR gate 50 is always 1 and thus CTRL=1 regardless of the output state of the PWM controller.

The Pon control signal can be used to reduce the standby current for certain devices. As the core component of a device, like CPU core, flash memory, clock generators or general peripherals are required only when the device is in its normal operating mode, their power supply can be cut for each domain not in use, reducing the standby current of that component to zero. This requires that the switching regulator be active during normal operation of the microcontroller, but it can be shut down when the microcontroller is not used, thereby reducing overall system power consumption.

Figure 5:
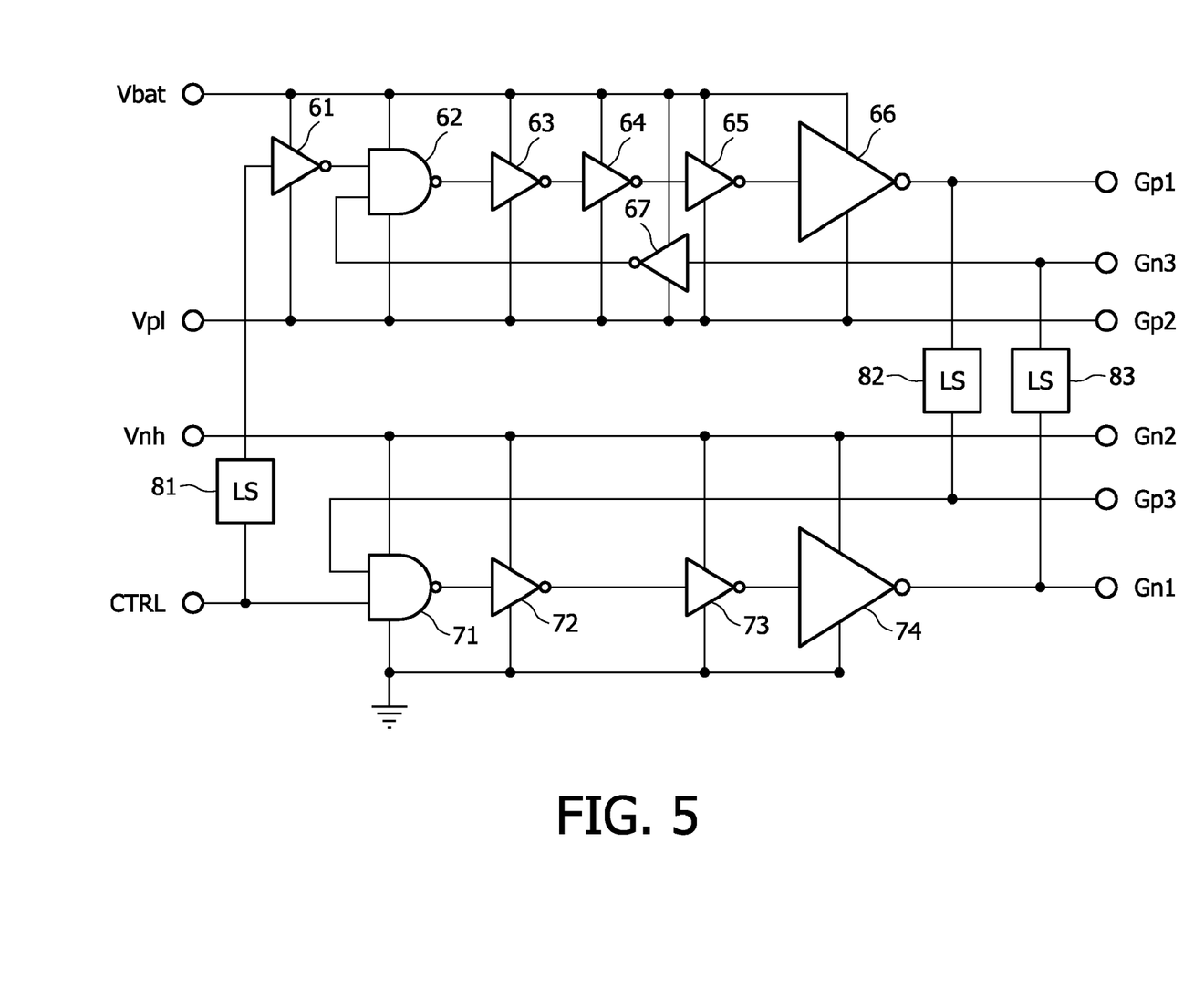
FIG. 5 is a circuit diagram of a control signal generator for use in the switching regulator of FIG. 4.

One possible implementation of the control signal generator 40 is shown in FIG. 5. The circuit comprises inverters 61, 63, 64, 65, and 67, a NAND gate 62, and an output driver 66 for generating control signals Gp1, and Gp3 via level shifter 82. Inverters 72 and 73, NAND gate 71, and output driver 74 are for generating control signals Gn1, and Gn3 via level shifter 83. Level shifters 81, 82 and 83 are needed to handle the different logic levels required.

When input CTRL=0, output Gn1=0 and output Gn3=Vp1 via level shifter 83. After a delay, output Gp1=Vp1 and output Gp3=0. This delay is the propagation delay from Gn1 via level shifter 83, inverter 67, NAND gate 62, three inverters 63, 64 and 65, and output driver 66 to Gp1, and then via level shifter 82 to Gp3. This results in turning HSPS on and LSPS off. Similarly, when CTRL=1, output Gp1=Vbat and output Gp3=Vnh. After another delay, output Gn1=Vnh and output Gn3=Vbat. This second delay is the propagation delay from Gp1 via level shifter 82, NAND gate 71, two inverters 72 and 73, and output driver 74 to Gn1, then via level shifter 83 to Gn3. As a result, LSPS is turned on and the HSPS is turned off. Here, it is seen that the dead time is determined by the two propagation delays.

For each of the MOS transistors within power switch LSPS, the voltage over any two terminals are now restricted within 0 and Vnh, where Vnh≦$V_{MAX}$, and $V_{MAX}$ is the maximum allowed voltage for a given process. Similarly, for each of the MOS transistors in power switch HSPS, the voltage over any two terminals are now lies in the range from Vp1 to Vbat−Vp1, where Vbat−Vp1≦$V_{MAX}$, i.e. Vp1≧Vbat−$V_{MAX}$. Alternatively, Vp1 can be considered as a DC voltage referring to Vbat. In this way, the voltage Vp1, like Vnh, may be a constant voltage independent of Vbat. Preferably Vp1 is not so high and Vnh not so low as to result in a gate-to-source voltage of the relevant transistor which is too low. This would require the use of larger transistors to achieve a suitable on-state resistance. It is preferred to set voltages Vp1 and Vnh approximately to values satisfying the relation Vp1=Vbat−Vnh, for example, Vnh=2.5V and Vp1=Vbat−2.5V.

Figure 6:
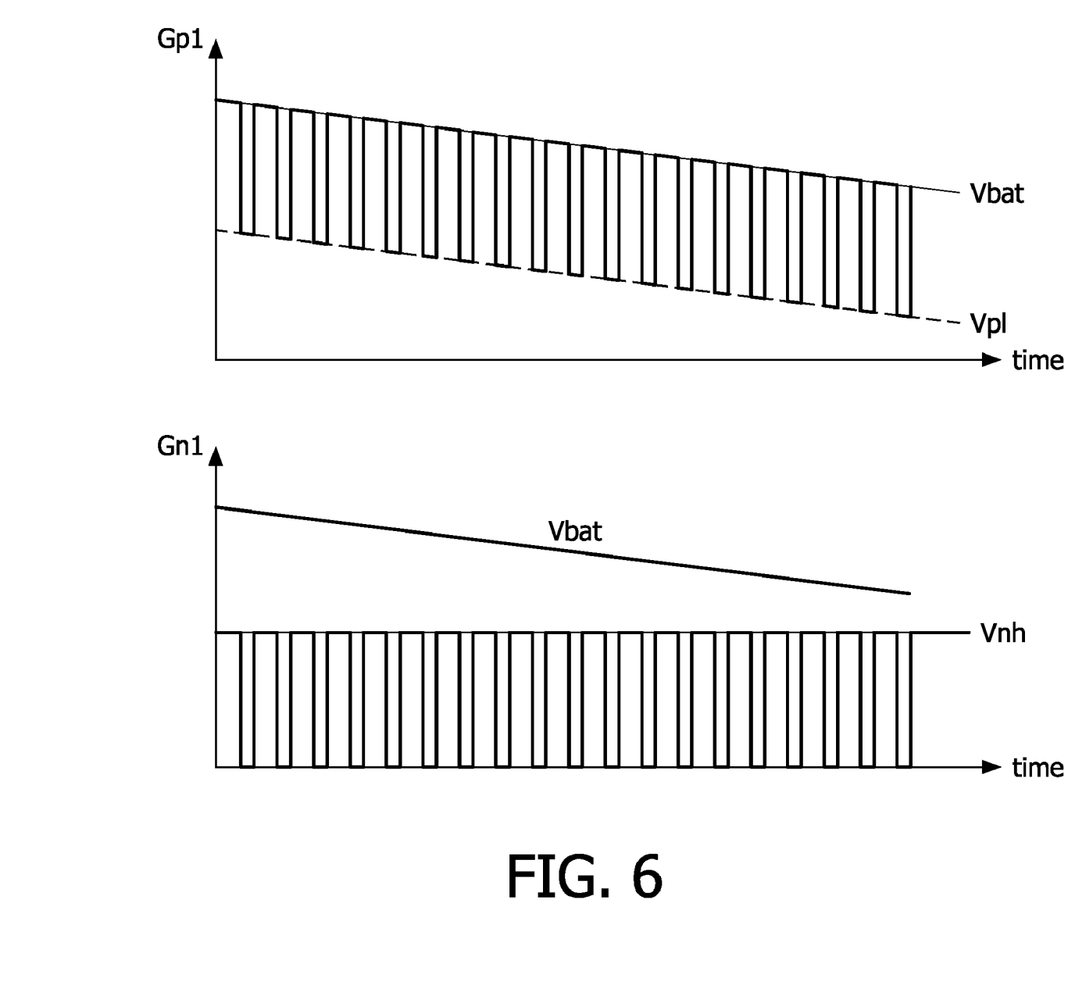
FIG. 6 is a diagram showing the variation of gate voltages for the switching regulator of FIG. 4.

FIG. 6 shows the waveform of gate voltages Gp1 and Gn1 for the switching regulator of FIG. 4. Here the battery voltage Vbat is considered not as a constant, but the battery voltage decreases as the battery discharges. In the switching regulator of FIG. 4, control voltage Vp1 decreases at the same rate as Vbat, keeping the voltage difference Vbat−Vp1 a constant, same as the voltage Vnh.

Figure 7:
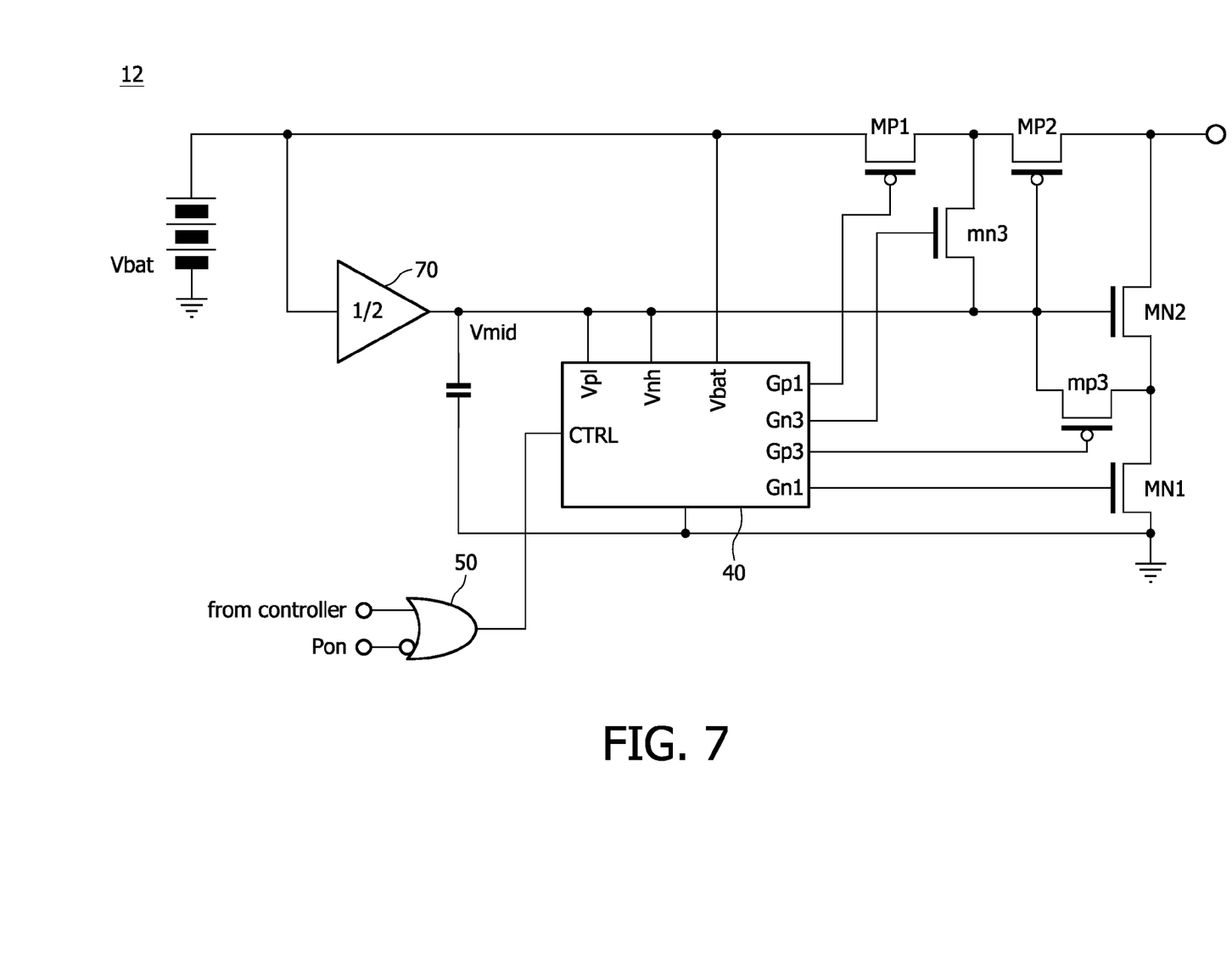
FIG. 7 is a circuit diagram of a simplified version of a switching regulator of FIG. 4.

Voltages Vp1 and Vnh can be derived from Vbat by using two linear regulators, or with two buffers plus two reference voltages (as shown in FIG. 4), where one linear regulator or buffer refers to ground and the other to Vbat. Two capacitors are also required for filtering purpose. This arrangement can be simplified and one example of this is shown in the embodiment of FIG. 7. In this embodiment, Vp1=Vnh=Vmid=Vbat/2. With this implementation, only one linear regulator or buffer 70 is required to generate the voltage Vmid.

Figure 8:
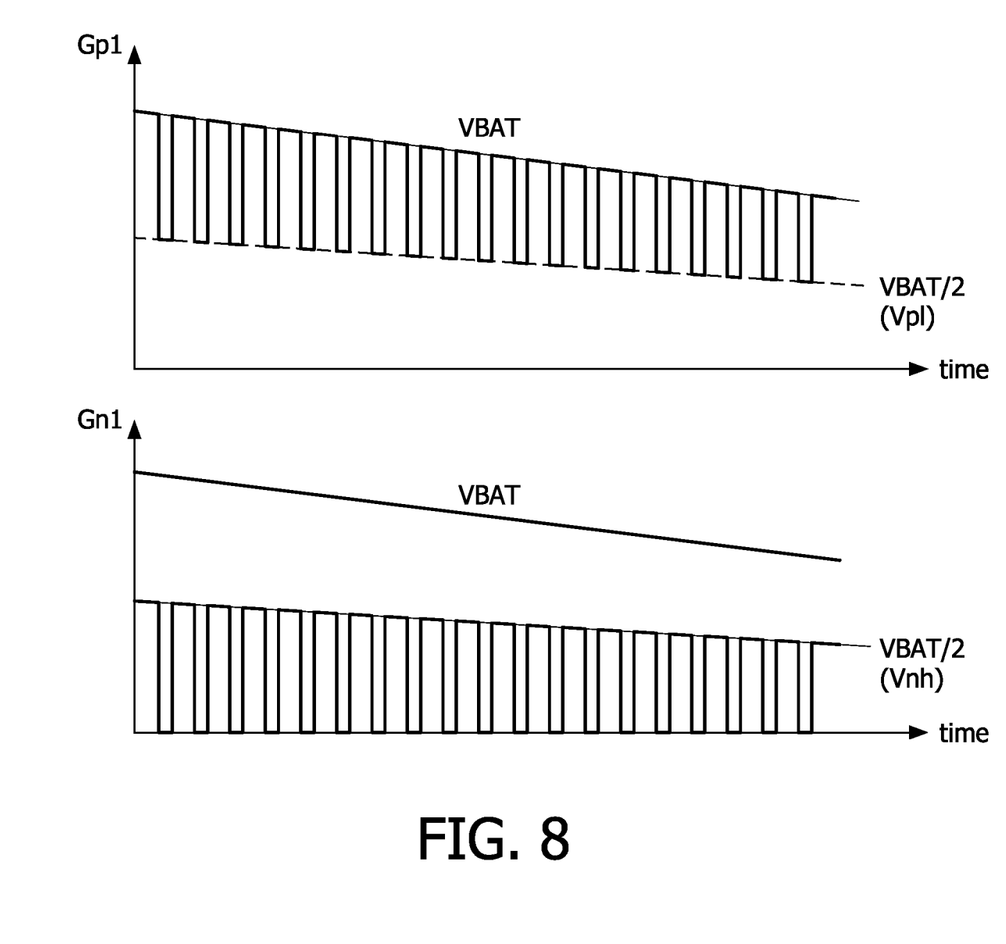
FIG. 8 is a diagram showing the variation of gate voltages for the switching regulator of FIG. 7.
Figure 9:
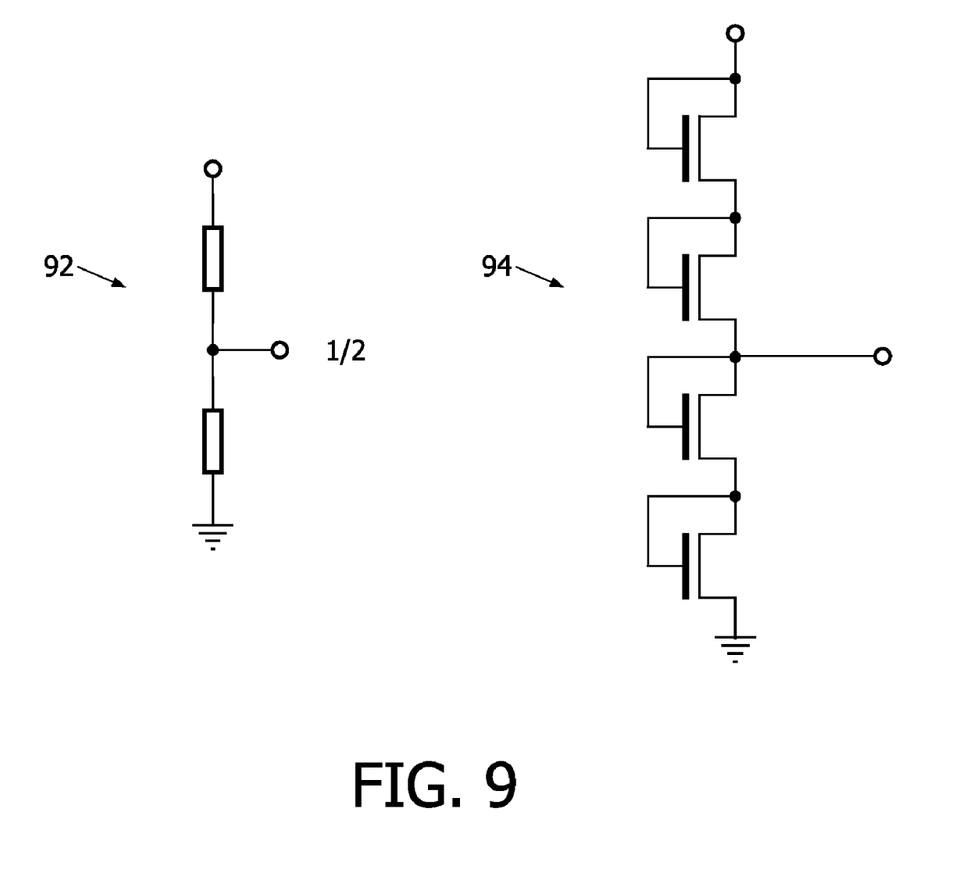
FIG. 9 is a circuit diagram of two voltage dividers for use in the switching regulator of FIG. 4 or FIG. 7.

FIG. 8 shows the waveform of gate voltages Gp1 and Gn1 for the simplified switching regulator of FIG. 7. As Vbat decreases due to discharge of the battery, Vp1 and Vnh also correspondingly decrease. This decrease in the control voltages causes a slight drop in power efficiency. However, a study of the simplified circuit of FIG. 7 shows that the maximum loss in power efficiency is only 3.7% lower using the simpler implementation. This loss in efficiency is offset by the advantages of having a simpler circuit that will occupy less silicon area, and less power consumption in the control circuit. The voltage Vmid may also be generated by a resistive divider followed by a buffer. Two simple voltage dividers 92 and 94 are shown in FIG. 9.

Figure 10:
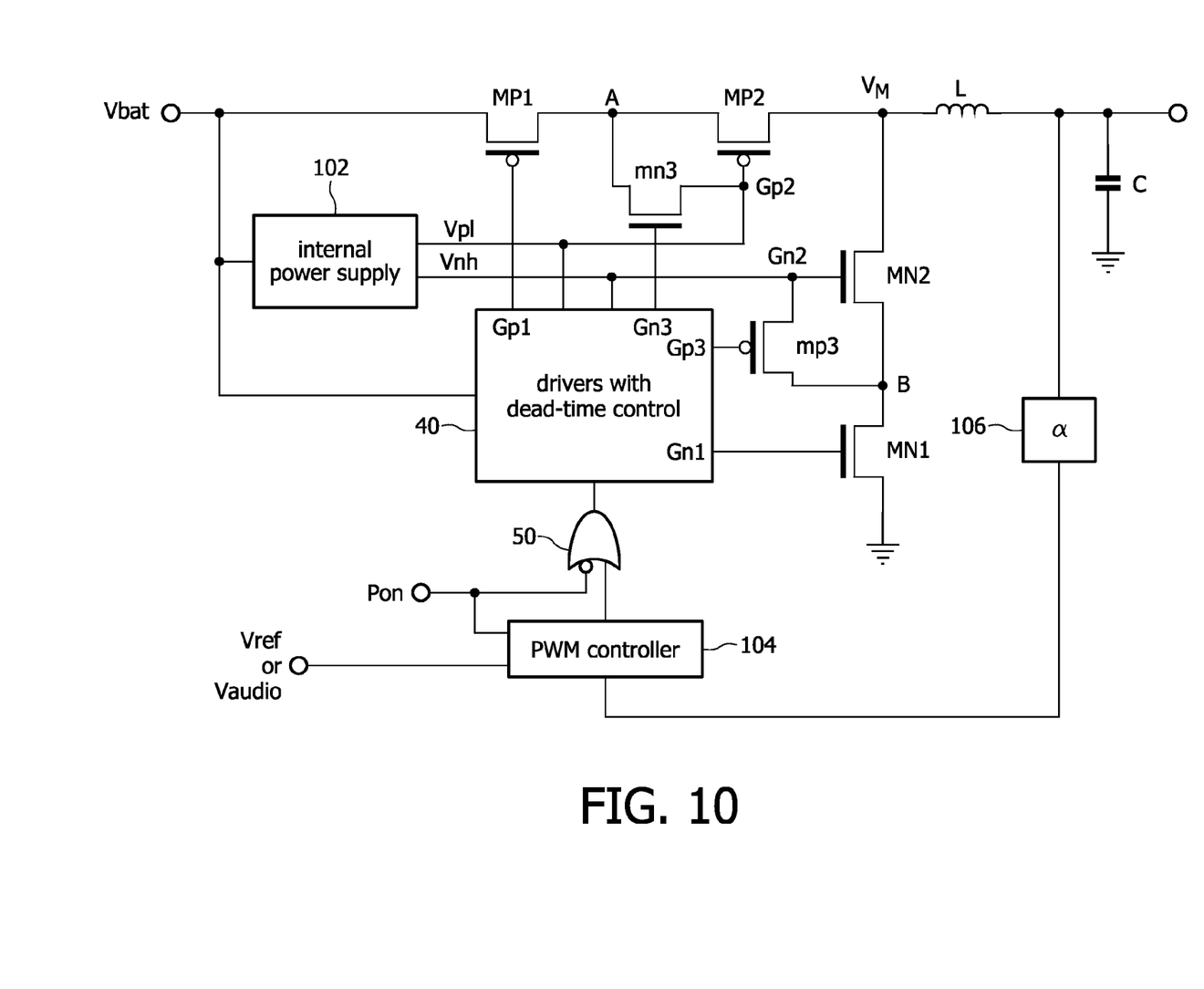
FIG. 10 is a circuit diagram of the switching regulator of FIG. 4 for use in a power supply or audio power amplifier application.

FIG. 10 shows the switching regulator of FIG. 4 integrated into a power supply circuit or audio power amplifier circuit, including inductor L, capacitor C, and control signal generator 40. Internal power supply 102 generates the intermediate voltages Vp1 and Vnh (or alternatively may generate a single intermediate voltage as in the embodiment of FIGS. 7 and 8). A PWM controller 104, output sensor 106, and OR gate 50 provide a control signal to the control signal generator 40.

Although the embodiments described above have only two transistors in series for each power switch, the technique can, in principle, be extended to use three or more transistors in series. This may be necessary if the battery voltage is too high, or if the maximum allowed voltage for the MOS transistors is too low. For example, if Vbat is higher than twice the maximum allowed voltage of the cascode (series-connected) transistors, then more than two cascode transistors may be required.

Where more than two cascode transistors are used in a switch, a DC voltage can be applied to the gate terminal of the cascode transistor closest to the node $V_M$, whereas switching signals derived from a PWM controller can be applied to the gate terminals of the outer cascode transistors farthest from node $V_M$. The middle cascode transistors may be have a DC voltage or the PWM signal applied to their gate terminals.

It is noted, that in this document the word 'comprising' does not exclude the presence of other elements or steps than those listed and the word 'a' or 'an' preceding an element does not exclude the presence of a plurality of such elements, that any reference signs do not limit the scope of the claims, that the invention may be implemented by means of both hardware and software, and that several 'means' or 'units' may be represented by the same item of hardware or software. Further, the scope of the invention is not limited to the embodiments, and the invention lies in each and every novel feature or combination of features described above. Furthermore, equivalents and modifications not described above may also be employed without departing from the scope of the invention, which is defined in the accompanying claims.

The invention claimed is:

1. A switching regulator for receiving an input voltage and comprising:
   a first power switch including:
      at least two transistors connected in series, the transistors having at least a first node where two of the transistors are connected; and
      at least a first control circuit configured to set a voltage at the first node to a first intermediate voltage when the first power switch is turned off, wherein the first control circuit includes a first switch configured to connect a gate terminal and a conduction terminal of one of the at least two transistors of the first power switch; and
   a second power switch including:
      at least two transistors connected in series, the transistors having at least a second node where two of the transistors are connected; and
      at least a second control circuit configured to set a voltage at the second node to a second intermediate voltage when the second power switch is turned off.

2. The switching regulator of claim 1 wherein the first power switch is connected between an input of the switching regulator and a third node and the second power switch is connected between a common voltage and the third node.

3. The switching regulator of claim 1 wherein the conduction terminal is a source terminal.

4. The switching regulator of claim 1 wherein the second control circuit includes a second switch configured to connect a gate terminal and a source terminal of one of the series connected transistors of the second power switch.

5. The switching regulator of claim 1 wherein the series-connected transistors of the first power switch have a first maximum permitted voltage across their terminals which is less than the input voltage of the switching regulator, the first intermediate voltage being greater than or equal to the input voltage less the first maximum permitted voltage.

6. The switching regulator of claim 5 wherein the series-connected transistors of the second power switch have a second maximum permitted voltage across their terminals which is less than the input voltage of the switching regulator, the second intermediate voltage being less than or equal to the second maximum permitted voltage.

7. The switching regulator of claim 6 wherein the first intermediate voltage equals the input voltage less the second intermediate voltage.

8. The switching regulator of claim 1 wherein one of the series connected transistors of the first power switch has a gate terminal which is configured to switch the one of the series connected transistors on during a period of time while another of the series connected transistors of the first power switch has a gate terminal which is configured to switch the other of the series connected transistors off.

9. The switching regulator of claim 8 wherein the first switch is configured to connect the gate terminal to the source terminal of the non-switched series connected transistor of the first power switch.

10. The switching regulator of claim 1 wherein the at least two transistors of the first power switch connected in series include a first transistor and a second transistor, a gate terminal of the first transistor being switched between the input voltage and the first intermediate voltage and a gate terminal of the second transistor being fixed at the first intermediate voltage, wherein the first control circuit is configured to utilize a third transistor to electrically connect the first node to the first intermediate voltage.

11. The switching regulator of claim 10 wherein the at least two transistors of the second power switch connected in series include a fourth transistor and a fifth transistor, a gate terminal of the fourth transistor being switched between ground and the second intermediate voltage and a gate terminal of the fifth transistor being fixed at the second intermediate voltage, wherein the second control circuit is configured to utilize a sixth transistor to electrically connect the second node to the second intermediate voltage.

12. A power supply circuit comprising:
a switching regulator, including:
a first power switch including:
at least two transistors connected in series, the transistors having at least a first node where two of the transistors are connected; and
at least a first control circuit configured to set a voltage at the first node to a first intermediate voltage when the first power switch is turned off, wherein the first control circuit includes a first switch configured to connect a gate terminal and a conduction terminal of one of the at least two transistors of the first power switch; and
a second power switch including:
at least two transistors connected in series, the transistors having at least a second node where two of the transistors are connected; and
at least a second control circuit configured to set a voltage at the second node to a second intermediate voltage when the second power switch is turned off;
a control signal generator for providing signals for switching at least one of the transistors of each of the power switches of the switching regulator; and
an internal power supply for providing the first and second intermediate voltages.

13. An audio power amplifier circuit comprising:
a switching regulator, including:
a first power switch including:
at least two transistors connected in series, the transistors having at least a first node where two of the transistors are connected; and
at least a first control circuit configured to set a voltage at the first node to a first intermediate voltage when the first power switch is turned off, wherein the first control circuit includes a first switch configured to connect a gate terminal and a conduction terminal of one of the at least two transistors of the first power switch; and
a second power switch including:
at least two transistors connected in series, the transistors having at least a second node where two of the transistors are connected; and
at least a second control circuit configured to set a voltage at the second node to a second intermediate voltage when the second power switch is turned off;
a control signal generator for providing signals for switching at least one of the transistors of each of the power switches of the switching regulator; and
an internal power supply for providing the first and second intermediate voltages.

14. A method for operating a switching regulator having an input voltage, the switching regulator comprising first and second power switches each comprising at least two transistors connected in series, the transistors having an upper gate to source threshold voltage across each transistor's terminals which is less than the input voltage, the transistors in the first power switch having a first node where two of the transistors are connected, and the transistors in the second power switch having a second node where two of the transistors are connected, comprising:
setting the voltage at the first node to a first intermediate voltage when the first power switch is turned off, so that the voltages across each transistor's terminals of the first power switch do not exceed the upper gate to source threshold voltage; and
setting the voltage at the second node to a second intermediate voltage when the second power switch is turned off, so that the voltages across each transistor's terminals of the second power switch do not exceed the upper gate to source threshold voltage, wherein setting the voltage at the first node includes utilizing an intermediate switch to couple a gate terminal of one of the transistors of the first power switch to a conduction terminal of another of the transistors of the first power switch.

15. The method of claim 14 wherein the first intermediate voltage is greater than or equal to the input voltage less the upper gate to source threshold voltage.

16. The method of claim 14 wherein the second intermediate voltage is less than or equal to the upper gate to source threshold voltage.

17. The method of claim 14 wherein the first intermediate voltage equals the input voltage less the second intermediate voltage.

* * * * *